United States Patent
Zhang

(10) Patent No.: US 12,108,588 B2
(45) Date of Patent: Oct. 1, 2024

(54) MEMORY AND METHOD FOR MANUFACTURING SAME

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 449 days.

(21) Appl. No.: 17/479,201

(22) Filed: Sep. 20, 2021

(65) Prior Publication Data
US 2023/0005915 A1   Jan. 5, 2023

Related U.S. Application Data

(63) Continuation of application No. PCT/CN2021/106545, filed on Jul. 15, 2021.

(30) Foreign Application Priority Data

Jul. 5, 2021   (CN) .......................... 202110758009.9

(51) Int. Cl.
| | |
|---|---|
| H10B 12/00 | (2023.01) |
| H01L 29/66 | (2006.01) |
| H01L 29/78 | (2006.01) |

(52) U.S. Cl.
CPC ....... H10B 12/20 (2023.02); H01L 29/66666 (2013.01); H01L 29/7827 (2013.01); H01L 29/7841 (2013.01)

(58) Field of Classification Search
CPC .......... H01L 29/66666; H01L 29/7841; H01L 29/7827; H10B 12/20; H10B 43/23–27
See application file for complete search history.

(56) References Cited

U.S. PATENT DOCUMENTS

| | | | | |
|---|---|---|---|---|
| 6,013,548 A | * | 1/2000 | Burns, Jr. | ............ H10B 12/053 438/242 |
| 6,617,651 B2 | | 9/2003 | Ohsawa | |

(Continued)

FOREIGN PATENT DOCUMENTS

| | | |
|---|---|---|
| CN | 1599070 A | 3/2005 |
| CN | 1650421 A | 8/2005 |

(Continued)

OTHER PUBLICATIONS

International Search Report in the international application No. PCT/CN2021/106545, mailed on Mar. 28, 2022. 2 pages.

(Continued)

*Primary Examiner* — Syed I Gheyas
*Assistant Examiner* — Casey Paul Boatman
(74) *Attorney, Agent, or Firm* — Kilpatrick Townsend & Stockton LLP

(57) ABSTRACT

A memory and a method for manufacturing the same are provided. The memory includes a substrate; at least one pair of transistors on a surface of the substrate, in which conductive channels of the transistors extend in a direction perpendicular to the surface of the substrate; storage layers, which each are located, in the direction perpendicular to the surface of the substrate, on a side surface of each of the transistors, the storage layers are interconnected with the conductive channels of the transistors, any one of the storage layers is located between the pair of transistors, and the storage layers are configured to store electric charges and transfer the electric charges between the storage layers and the conductive channels interconnected therewith.

18 Claims, 22 Drawing Sheets

(56) References Cited

U.S. PATENT DOCUMENTS

| | | |
|---|---|---|
| 6,897,531 B2 | 5/2005 | Ohsawa |
| 6,956,256 B2 | 10/2005 | Forbes |
| 7,149,109 B2 | 12/2006 | Forbes |
| 7,224,024 B2 | 5/2007 | Forbes |
| 7,241,658 B2 | 7/2007 | Forbes |
| 7,298,638 B2 | 11/2007 | Forbes |
| 7,323,380 B2 | 1/2008 | Forbes |
| 7,525,146 B2 | 4/2009 | Song |
| 7,528,440 B2 | 5/2009 | Forbes |
| 7,790,529 B2 | 9/2010 | Parekh |
| 7,906,397 B2 | 3/2011 | Song |
| 7,977,707 B2 | 7/2011 | Hong |
| 8,013,376 B2 | 9/2011 | Parekh |
| 8,084,316 B2 | 12/2011 | Huo |
| 8,344,436 B2 | 1/2013 | Parekh |
| 8,405,137 B2 | 3/2013 | Huo |
| 8,514,626 B2 | 8/2013 | Sandhu |
| 8,530,288 B2 | 9/2013 | Parekh |
| 8,575,672 B2 | 11/2013 | Song |
| 8,669,603 B2 | 3/2014 | Parekh |
| 9,000,409 B2 | 4/2015 | Huo |
| 9,112,046 B2 | 8/2015 | Sandhu |
| 10,497,708 B1 | 12/2019 | Chen et al. |
| 2001/0055838 A1 | 12/2001 | Walker |
| 2002/0154556 A1 | 10/2002 | Endoh |
| 2003/0015757 A1 | 1/2003 | Ohsawa |
| 2004/0026749 A1 | 2/2004 | Ohsawa |
| 2004/0042256 A1* | 3/2004 | Forbes .............. G11C 11/404 257/E21.654 |
| 2004/0174734 A1 | 9/2004 | Forbes |
| 2005/0024936 A1 | 2/2005 | Forbes |
| 2005/0032313 A1 | 2/2005 | Forbes |
| 2005/0041457 A1 | 2/2005 | Forbes |
| 2005/0133860 A1 | 6/2005 | Forbes |
| 2006/0011972 A1* | 1/2006 | Graham .............. G11C 13/025 257/E29.301 |
| 2006/0249770 A1 | 11/2006 | Huo |
| 2006/0252206 A1 | 11/2006 | Forbes |
| 2006/0284236 A1* | 12/2006 | Bhattacharyya ........ H01L 21/84 257/314 |
| 2007/0057309 A1 | 3/2007 | Song |
| 2007/0158722 A1 | 7/2007 | Forbes |
| 2008/0150003 A1 | 6/2008 | Chen |
| 2008/0280409 A1 | 11/2008 | Parekh |
| 2009/0162977 A1 | 6/2009 | Purayath |
| 2009/0239345 A1 | 9/2009 | Song |
| 2010/0295109 A1 | 11/2010 | Parekh |
| 2011/0163371 A1 | 7/2011 | Song |
| 2011/0284940 A1 | 11/2011 | Parekh |
| 2012/0061752 A1 | 3/2012 | Huo |
| 2012/0161094 A1 | 6/2012 | Huo |
| 2013/0011978 A1 | 1/2013 | Parekh |
| 2013/0028016 A1 | 1/2013 | Sandhu |
| 2013/0264630 A1* | 10/2013 | Kim ..................... H10B 12/053 257/321 |
| 2013/0299893 A1 | 11/2013 | Sandhu |
| 2013/0341725 A1 | 12/2013 | Parekh |
| 2014/0110775 A1 | 4/2014 | Song |
| 2015/0348977 A1 | 12/2015 | Barth, Jr. |
| 2016/0086970 A1 | 3/2016 | Peng |
| 2016/0163731 A1 | 6/2016 | Tan |
| 2020/0168610 A1 | 5/2020 | Lu |
| 2021/0028174 A1 | 1/2021 | Lee |

FOREIGN PATENT DOCUMENTS

| | | |
|---|---|---|
| CN | 101079450 A | 11/2007 |
| CN | 101090117 A | 12/2007 |
| CN | 101582426 B | 6/2011 |
| CN | 102544049 A | 7/2012 |
| CN | 103703564 A | 4/2014 |
| CN | 108807660 A | 11/2018 |
| CN | 111785719 A | 10/2020 |
| CN | 112567514 A | 3/2021 |
| CN | 12768488 A | 5/2021 |
| CN | 112864158 A | 5/2021 |
| DE | 10334113 A1 | 3/2005 |
| EP | 1280205 A2 | 1/2003 |
| JP | H07176628 A | 7/1995 |
| KR | 20090018505 A | 2/2009 |

OTHER PUBLICATIONS

First Office Action of the Chinese application No. 202110758009.9, issued on Jun. 10, 2023. 7 pages with English abstract.

International Search Report in the international application No. PCT/CN2021/106532, mailed on Apr. 8, 2022, 3 pages.

English translation of the Written Opinion of the International Search Authority in the international application No. PCT/CN2021/106532, mailed on Apr. 8, 2022, 2 pages.

First Office Action of the Chinese application No. 202110758651.7, issued on Jun. 12, 2023, 14 pages with English translation.

Restriction Requirement Office Action of the U.S. Appl. No. 17/479,148, issued on Jan. 25, 2024, 7 pages.

Notice of Allowance of the U.S. Appl. No. 17/479,148, issued on Apr. 3, 2024, 42 pages.

* cited by examiner

MEMORY AND METHOD FOR MANUFACTURING SAME

CROSS-REFERENCE TO RELATED APPLICATIONS

The present application is a U.S. continuation application of International Application No. PCT/CN2021/106545, filed on Jul. 15, 2021, which claims priority to Chinese Patent Application No. 202110758009.9, filed on Jul. 5, 2021. International Application No. PCT/CN2021/106545 and Chinese Patent Application No. 202110758009.9 are incorporated herein by reference in their entireties.

TECHNICAL FIELD

Embodiments of this application relate to, but are not limited to, a memory and a method for manufacturing the same.

BACKGROUND

With the continuous growth of semiconductor market demands and rapid development of semiconductor memory technologies, memory manufacturing technologies, especially the Dynamic Random Access Memory (DRAM) technology has been developed rapidly and occupied the main position in the memory market. The common DRAM unit comprises one Transistor and one Capacitor to form a 1T1C structure, and logic states are distinguished on the basis that the capacitor stores electric charges or not. However, the market puts forward higher and higher requirements on the storage performance and the unit size of the memory at present, so serious challenges have been brought to the designing and manufacturing of the memory.

SUMMARY

According to a first aspect, the memory includes a substrate, at least one pair of transistors on a surface of the substrate, and storage layers.

Conductive channels of the transistors extend in a direction perpendicular to the surface of the substrate.

The storage layers each are located, in a direction perpendicular to the surface of the substrate, on a side surface of each of the transistors. The storage layers are interconnected with the conductive channels of the transistors. Any one of the storage layers is located between the pair of transistors. The storage layers are configured to store electric charges and transfer the electric charges between the storage layers and the conductive channels interconnected therewith.

According to a second aspect, a method for manufacturing a memory includes the following operations.

At least one pair of transistors is formed on a surface of a substrate, in which conductive channels of the transistors extend in a direction perpendicular to the surface of the substrate.

Storage layers each are formed, in a direction perpendicular to the surface of the substrate, on a side surface of each of the transistors. The storage layers are interconnected with the conductive channels of the transistors, and any one of the storage layers is located between the pair of transistors. The storage layers are configured to store electric charges and transfer the electric charges between the storage layers and the conductive channels interconnected therewith.

DETAILED DESCRIPTION

The technical solution of this application may be applied to the designing and manufacturing of the semiconductor memory, for example, a commonly used DRAM semiconductor memory. Usually, a DRAM uses capacitors for the storage of electric charges, and a binary bit value is represented by the storage capacity of the electric charges, that is, one storage unit may be configured to represent a logic state of one bit. Due to phenomena such as leakage current of the transistors, the stored electric charges are liable to be loss, and then the stability of the data storage is affected. Therefore, the DRAM needs to be periodically charged and discharged to refresh the storage data and achieve dynamic storage.

As two capacitor plates, a dielectric layer and other structures are required, a capacitor structure needs to occupy a greater space size, such that a size of a single storage unit is hard to be reduced, and the overall size of the memory is also limited by this bottleneck. Therefore, the embodiments of this application provide a memory, in which the transfer and storage of electric charges are implemented by storage layers interconnected with the conductive channels of the transistors. In this way, a storage unit structure of 1T0C is achieved without a capacitor, thereby effectively reducing the size of the memory.

The technical solution of this application is further described in details below in combination with the drawings and the embodiments.

Figure 1:
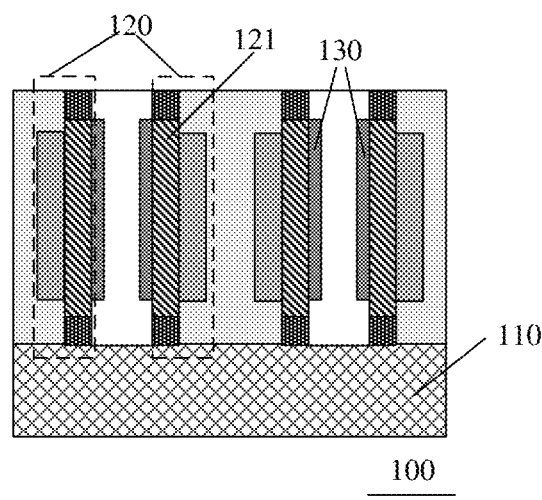
FIG. 1 is a structural schematic diagram I of a memory according to an embodiment of this application.

An embodiment of this application provides a memory. As shown in FIG. 1, the memory 100 includes a substrate 110, at least one pair of transistors 120 on a surface of the substrate 110, and storage layers 130. Conductive channels 121 of the transistors 120 extend in a direction perpendicular to the surface of the substrate. The storage layers 130 each are located, in a direction perpendicular to the surface of the substrate, on a side surface of each of the transistors 120. The storage layers 130 are interconnected with the conductive channels 121 of the transistors 120. Any one of the storage layers 130 is located between the pair of transistors 120. The storage layers 130 are configured to store electric charges and transfer the electric charges between the storage layers and the conductive channels interconnected therewith.

The substrate herein may be a semiconductor substrate formed by a silicon material or other wafer materials. The device structures of the memory may be manufactured and formed on the surface of the substrate through various semiconductor device processes, for example, doping, photoetching, depositing, cleaning and other processes. A layered patterning structure is formed on the surface of the substrate, and further the semiconductor device is formed.

In the embodiments of this application, a plurality of transistors are formed on the surface of the substrate, and the transistors are arranged on the surface of the substrate in pairs. Multiple pairs of transistors may be arranged in rows and columns so as to form transistor arrays for forming the memory.

Herein, the conductive channels of the transistors extend in a direction perpendicular to the surface of the substrate, which may occupy less surface area of the substrate, compared with the transistors formed in a direction parallel to the surface of the substrate. Thus, the utilization rate of the substrate area is improved.

In the embodiments of the disclosure, the storage of electric charges is implemented through the storage layer interconnected with the conductive channel of each transistor, and the storage layers can transfer electric charges between the storage layers and the conductive channels, so as to change the logic state of the storage unit. The storage layers may be a semiconductor material or a metal material which is capable of storing electrons or holes. The storage layers are interconnected with the conductive channels. When voltage is applied to the transistors, the electric charges accumulates in the conductive channels and potential difference is formed between the conductive channels and the storage layers, so that electric charge transferring occurs between the conductive channels and the storage layers to change the amount of the electric charges in the storage layers. Thus, the electric charge transferring between the storage layers and the conductive channels may be implemented by controlling the transistors, and the electric charges can be stored in the storage layers.

The storage layers are arranged on the side surface of each transistor and interconnected with the conductive channels of the transistors. Further, the storage layers extend in the direction perpendicular to the surface of the substrate, so that less surface area of the substrate is occupied.

In addition, in the embodiments of this application, the storage layers are located between a pair of transistors. The pair of transistors may be synchronously formed, and the storage layers corresponding to the pair of transistors are synchronously formed in the space between the pair of transistors. Thus, on the one hand, the process is simplified, and the process steps are saved, on the other hand, the process difference between the transistors may be reduced by a synchronous manufacturing process for the pair of transistors and the corresponding storage layers.

The abovementioned memory structure provided by the embodiments of this application not only saves the manufacturing space required by the capacitor structure in the memory, but also saves the occupation of the surface area of the substrate by arranging the transistors in a manner perpendicular to the substrate, thereby effectively increasing the quantity of the storage unit in a unit area. Embodiments of this application implement electric charge storage by the storage layers for replacing the function of original capacitors, so that the storage unit structure of 1T0C is obtained, which is beneficial to the development of small size and high integration of the memory.

Figure 2:
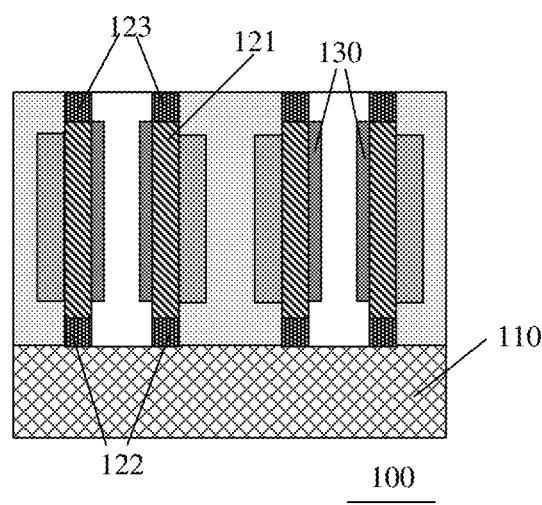
FIG. 2 is a structural schematic diagram II of a memory according to an embodiment of this application.

In some embodiments, as shown in FIG. 2, the source electrodes 122 of the transistors 120 are located at one end, close to the surface of the substrate 110, of the conductive channels 121. The drain electrodes 123 of the transistors 120 are located at one end, away from the surface of the substrate 110, of the conductive channels 121.

A transistor includes a source electrode, a gate electrode and a drain electrode. The conduction of electric charges between the source electrode and the drain electrode can be switched on or off by the voltage control of the gate electrode and the voltage difference between the source electrode and the drain electrode. In the embodiments of this application, the conductive channels of the transistors extend in a direction perpendicular to the surface of the substrate. Therefore, the source electrodes and the drain electrodes of the transistors are respectively located at two ends of the conductive channels, that is, one end close to the surface of the substrate and one end away from the surface of the substrate.

Thus, the structures of the transistors may effectively use the height space above the substrate and save the surface area of the substrate, so that more storage units may be integrated on a unit area of the substrate surface and the storage efficiency of the memory is improved.

In some embodiments, first insulation layers are provided around the source electrodes of the transistors to cover the source electrodes of the transistors, and the height of the first insulation layers relative to the surface of the substrate is higher than that of the source electrodes relative to the surface of the substrate.

Around the source electrodes of the transistors, the source electrodes of the transistors may be covered by first insulation layers, thereby achieving the effect of protecting the source electrodes and isolating the source electrodes from the storage layers. The first insulation layer may be uniformly distributed on the surface of the substrate in a certain thickness such that the first insulation layer with this thickness may completely cover the source electrodes of the transistors, and the height of the first insulation layer relative to the surface of the substrate is higher than that of the source electrodes relative to the surface of the substrate.

Herein, the material of the first insulation layers may be a material such as silicon oxide, silicon nitride, or organic materials and the like.

In some embodiments, second insulation layers are provided between the two storage layers corresponding to the pair of transistors, and the second insulation layers are interconnected with the first insulation layers.

In the embodiments of this application, a storage layer corresponding to each transistor is located between the corresponding pair of transistors, that is to say, the storage layers are located on opposite inner sides of each pair of transistors. The storage layers corresponding to different transistors need to be mutually isolated, and two storage layers may be mutually isolated by the second insulation layers.

Moreover, since the first insulation layer covers the source electrodes of the transistors, the first insulation layer is also present between a pair of transistor. Herein, the first insulation layers are interconnected with the second insulation layers, so as to form a complete insulation layer which isolates the source electrodes of the transistors from the storage layers each other. Further, the source electrodes of the transistors and the storage layers are covered by the insulation layer, so as to reduce electric charge movement between the source electrodes and the storage layers and facilitate the storage layers to store electric charges stably.

Herein, the first insulation layer and the second insulation layer may be made of the same material or different materials.

Figure 3:
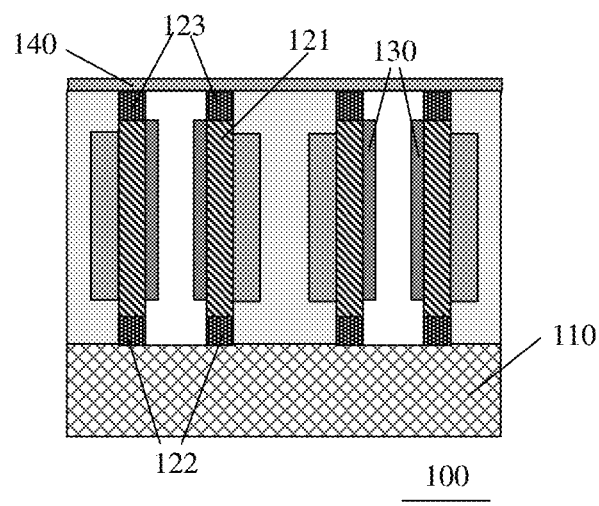
FIG. 3 is a structural schematic diagram III of a memory according to an embodiment of this application.

In some embodiments, as shown in FIG. 3, the memory 100 further includes at least one bit line 140.

The bit line 140 is located at one side, away from the surface of the substrate 110, of the transistors 120, and the bit line 140 is connected to the drain electrodes 123 of the transistors 120.

In the embodiments of this application, the plurality of transistors of the memory may be arranged to form a transistor array with a row-column structure. Each column of transistors may be connected through the bit line, so that the whole column of transistors may be controlled through the bit line to read-write data.

The bit line may be a linear film formed by a conductive material, and the bit line is connected to the drain electrodes of the transistors so as to transfer electric charges between the bit line and the drain electrodes of the transistors. Depending on the potential of the bit line, the transistors read or write data. Therefore, the potential of the bit line may be changed by applying voltage to the bit line of the memory through an external circuit.

In some embodiments, the bit line covers the surfaces of the drain electrodes of at least one pair of transistors.

In the embodiments of this application, one bit line may cover multiple pairs of transistors. That is to say, one pair of transistors may be connected through the same bit line. Thus, one same bit line may control more transistors. Thus, the accurate control of each transistor can be achieved by cooperation with a word line in the memory.

Figure 4:
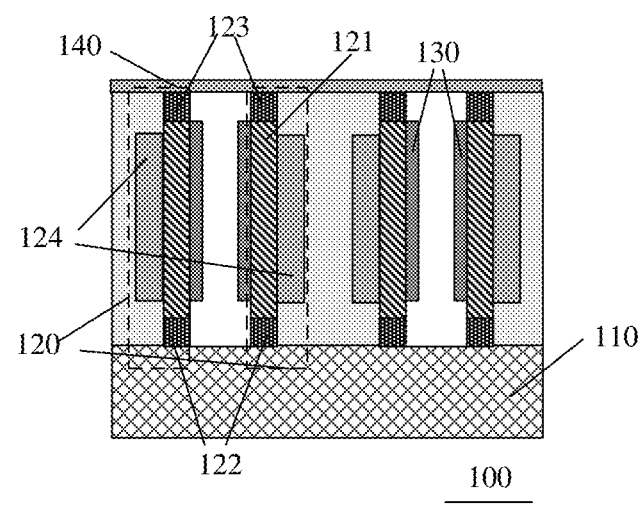
FIG. 4 is a structural schematic diagram IV of a memory according to an embodiment of this application.

In some embodiments, as shown in FIG. 4, two gate electrodes 124 corresponding to a pair of transistors 120 are respectively located on one side parallel to the conductive channels 121, and two conductive channels 121 of the pair of transistors 120 are located between the two gate electrodes 124 of the pair of transistors 120.

Since the conductive channels of the transistors in the embodiments of this application extend in a direction perpendicular to the surface of the substrate, the electric charge flowing between the source electrodes and the drain electrodes of the transistors is also in a direction extending along the conductive channels. The gate electrodes of the transistors control the conductive performance of the conductive channels from one side of the conductive channels, and the gate electrodes of the transistors are located on the side surfaces of the conductive channels and are parallel to the conductive channels. The storage layers corresponding to a pair of transistors are respectively located between the conductive channels of the pair of transistors, so the inner sides of the conductive channels of a pair of transistors are provided with the storage layers, and the outer sides of the conductive channels of a pair of transistors are provided with the gate electrodes corresponding to the pair of transistors.

Thus, each pair of transistors and the corresponding storage layers together form an axisymmetric structure with a central line between the two storage layers as an axis. The gate electrodes are respectively located on two sides of the pair of transistors as a whole.

In some embodiments, a gate electrode includes a gate oxide layer and a gate conductive layer.

The gate oxide layer is located between the gate conductive layer and the conductive channel.

Alternatively, the gate oxide layer wraps the gate conductive layer and is connected to the conductive channel.

In the embodiments of this application, the gate oxide layer is arranged between the conductive channel of the transistor and the gate conductive layer of the transistor, so as to isolate the gate conductive layer from the conductive channel. Thus, the conductive performance of the conductive channel may be controlled by a field effect generated between the potential of the gate conductive layer and the conductive channel That is to say, the conduction of the conductive channel may be switched on or off by the voltage applied to the gate conductive layer.

The gate oxide layer and the gate conductive layer form a two-layer structure parallel to the conductive channel. The outer side of the gate conductive layer may be isolated by an insulation material, such that the gate electrodes of adjacent transistors are independent of each other. Moreover, the gate oxide layer may also wrap the gate conductive layer, so that both the inner side and outer side of the gate conductive layer are isolated by the gate oxide layer.

In some embodiments, the memory further includes gate protective layers.

The gate protective layers cover one side, away from the surface of the substrate, of the gate electrodes.

The gate protective layers are arranged above the gate electrodes and may be flush with the drain electrodes of the transistors, so as to isolate the gate electrodes from the drain electrodes and from other structures at the tops of the transistors, for example, the bit line.

The gate protective layers may be formed by oxides or insulation materials, such as silicon nitride. Certainly, the gate protective layers may also be a film of the same material as the gate oxide layers, and are interconnected with the gate oxide layers so as to protect and isolate the gate conductive layers.

In some embodiments, the gate electrodes of at least two transistors are interconnected with each other. Herein, the interconnected gate electrodes form the word line of the at least two transistors, and the at least two transistors are located in a same straight line and in different pairs.

In the embodiments of this application, a gate electrode of a transistor is shared by a plurality of transistors. That is to say, the gate electrode in a strip shape covers the sides of the conductive channels of the plurality of transistors.

Thus, the transistors located in a same row are controlled by a same gate electrode which forms the word line of this row of transistors.

For the memory as a whole, two rows of transistors formed by multiple pairs of transistors are respectively controlled by two word lines located at two sides of the paired transistors. Thus, the word lines and the bit lines of the transistor array form a structure in which the row and column are respectively controlled, such that accurate read-write control of each transistor can be achieved.

Figure 5:
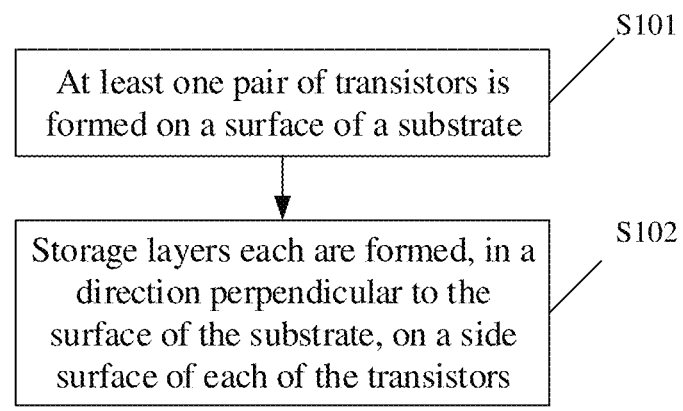
FIG. 5 is a flow schematic diagram of a method for manufacturing a memory according to an embodiment of this application.

Embodiments of this application further provide a method for manufacturing a memory. As shown in FIG. 5, the method includes the following operations.

At S101, at least one pair of transistors is formed on a surface of a substrate. Conductive channels of the transistors extend in a direction perpendicular to the surface of the substrate.

At S102, the storage layers each are formed, in the direction perpendicular to the surface of the substrate, on a side surface of each of the transistors. The storage layers are interconnected with the conductive channels of the transistor. Any one of the storage layers is located between the pair of transistors. The storage layers are configured to store electric charges and transfer the electric charges between the storage layers and the conductive channels interconnected therewith.

Herein, in the step that at least one pair of transistors is formed on a surface of a substrate, a plurality of transistors may be synchronously formed on the surface of the substrate. For example, a transistor array with a row-column structure is synchronously formed.

Figure 6A:
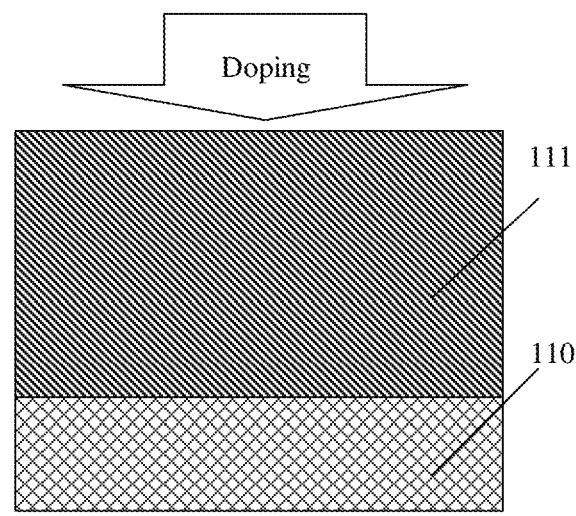
FIG. 6A is a schematic diagram for doping a substrate in a method for manufacturing a memory according to an embodiment of this application.

In the embodiments of this application, doping, ion injection and other treatments may be performed on the surface of the substrate in a certain thickness, so that the certain thickness of the substrate has stronger conductive performance. A doped semiconductor layer of the surface of the substrate is shown in FIG. 6A. The upper layer of the substrate 110 is the semiconductor layer after treatment, which may be referred to as an active layer 111 herein.

Figure 6B:
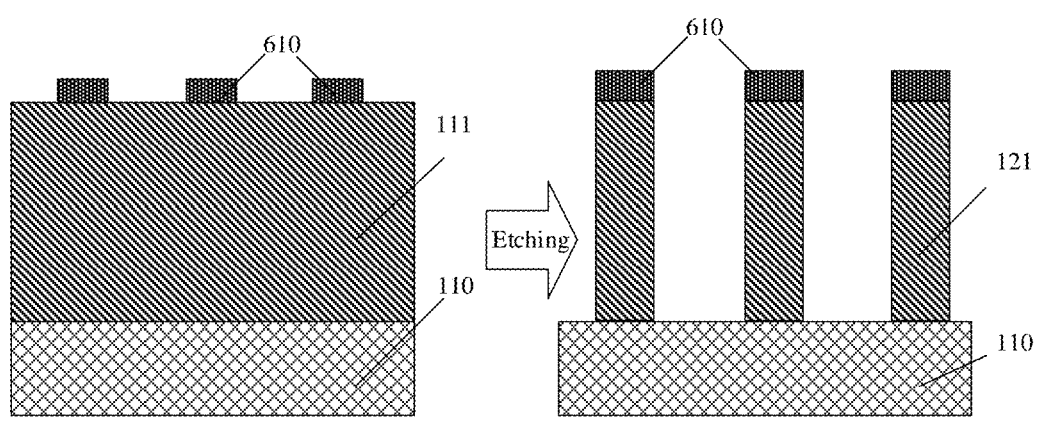
FIG. 6B is a schematic diagram for forming conductive channels by etching in a method for manufacturing a memory according to an embodiment of this application.

Then a plurality of conductive channels distributed in rows and columns are formed by a photoetching process and other processes. As shown in FIG. 6B, the process of forming the conductive channels 121 may include: a mask layer 610 is provided to cover the surface of the active layer, and then part of the semiconductor material of the active layer is removed by patterning processes, such as irradiation, etching, and the remaining part forms the conductive channels 121 of the plurality of transistors. The remaining substrate at the bottom forms the substrate of the memory, as a support for the transistor array, configured to provide connection between ground potential and the source electrodes or drain electrodes of the transistors. Moreover, the source electrodes, the gate electrodes, the drain electrodes and other structures of the transistors may be respectively formed at various adjacent positions of the conductive channels of the transistors, to form the transistor array of the memory. Thus, the formed conductive channels perpendicularly extend relative to the surface of the substrate, so less surface area of the substrate may be occupied, and the integration of the memory is improved.

In the embodiments of this application, for each transistor, one storage layer may be correspondingly formed, which may be interconnected with the conductive channel of the each transistor. Therefore, the semiconductor material or metal material used for forming the storage layer may be provided to cover a side of the conductive channel of the each transistor, to form a film.

Thus, the uniformly distributed transistor array and two storage layers between each pair of transistors are formed. Each transistor is provided with the corresponding and independent storage layer. During using the memory, electric charge flowing and electric charge storage of the corresponding storage layer may be achieved by controlling each transistor. For the memory as a whole, the functions of read-write and storage of the data may be achieved by controlling the transistors at different positions.

In some embodiments, the operation that the storage layers each are formed, in the direction perpendicular to the surface of the substrate, on a side surface of each of the transistors includes the following operations.

Trenches are formed between two conductive channels of the pair of transistors.

A semiconductor material or metal material is deposited in the trenches, so as to cover side walls and bottoms of the trenches.

The semiconductor material or metal material at the bottoms of the trenches is removed by etching, to form the storage layers corresponding to the transistors.

During forming the conductive channels of the transistors on the substrate, the semiconductor material of the active layer between the transistors needs to be removed, so that each conductive channel stands on the bottom layer of the substrate perpendicularly. Therefore, the trenches are formed between the conductive channels in the abovementioned process. The storage layer of each transistor may be formed between two conductive channels which will form a pair of transistors, and the storage layer is provided in the trenches between each pair of transistors.

For example, by deposition of the semiconductor material or metal material, for example, monocrystalline silicon (Si), germanium (Ge), silicon-germanium (Si—Ge), aluminum-stibium (Al—Sb) or gallium-stibium (Ga—Sb) in the above trenches, the inner sides of a pair of transistors are covered with the above semiconductor material or metal material, and then the above materials at the bottoms of the trenches may be removed by etching to form two mutually separated storage layers which are interconnected with the two conductive channels of the pair of transistors respectively. The deposition may include Physical Vapor Deposition (PVD) and Chemical Vapor Deposition (CVD).

Thus, the uniformly distributed transistor array and two storage layers between each pair of transistors are formed. Each transistor is provided with the corresponding and independent storage layer. During using the memory, electric charge flowing and electric charge storage of the corresponding storage layer may be achieved by controlling each transistor. For the memory as a whole, the functions of read-write and storage of the data may be achieved by controlling the transistors at different positions.

In some embodiments, the operation of forming at least one pair of transistors on the surface of the substrate includes the following operations.

The conductive channels perpendicular to the surface of the substrate are formed on the surface of the substrate.

The source electrodes of the transistors are formed at one end, close to the surface of the substrate, of the conductive channels.

The drain electrodes of the transistors are formed at one end, away from the surfaces of the substrates, of the conductive channels.

A transistor includes a source electrode, a gate electrode and a drain electrode. The conduction of electric charges between the source electrode and the drain electrode can be switched on or off by the voltage control of the gate electrode and the voltage difference between the source electrode and the drain electrode. In the embodiments of this application, the extending direction of the conductive channels of the transistors is a direction perpendicular to the surface of the substrate. Therefore, the source electrodes and the drain electrodes of the transistors are respectively located at two ends of the conductive channels, that is, one end close to the surface of the substrate and one end away from the surface of the substrate.

In the embodiments of this application, after forming the conductive channels, the source electrodes of the transistors may be firstly formed at one end, close to the surface of the substrate, of the conductive channels. In this case, the source electrodes are interconnected with the substrate, so the source electrodes may be grounded through the substrate. Then the drain electrodes of the transistors may be formed at one end, away from the surface of the substrate, of the conductive channels. Thus, the electric charge transfer of the transistors is along a conductive path formed by the conductive channels from the source electrodes to the drain electrodes.

It is noted that the order of forming the source electrodes, the drain electrodes and the gate electrodes of the conductive channels and the storage layers is not limited herein. The storage layers may be formed after forming the source electrodes, the drain electrodes and the gate electrodes of the conductive channels as described in the above. Alternatively, the storage layers are formed after forming the source electrodes of the conductive channels, and then the drain electrodes and the gate electrodes are formed. In an actual application, the abovementioned formation order may be determined by comprehensively considering the production plans, the shape of the photomask for each layer, the properties of the material of each layer, the device parameters required for the manufacturing process and the like.

In some embodiments, the operation of forming the conductive channels perpendicular to the surface of the substrate on the surface of the substrate includes the following operations.

Doping is performed on a silicon material substrate, so as to form an active layer.

The active layer is subjected to pattern etching, so as to form the conductive channels perpendicular to the surface of the substrate.

The substrate may be a semiconductor substrate formed by a silicon material or other wafer materials. In a process of forming the transistors, a certain thickness of semiconductor material on the surface layer of the substrate may be firstly doped. The doping may be N-type doping or P-type doping. For example, the doping or ion injection is performed with trivalent ions or pentavalent ions, such as phosphonium ions or boron ions, so that a P-type semiconductor or an N-type semiconductor is formed on the surface layer of the substrate. The purpose of doing so is to improve the conductive performance of the semiconductor material, such that it is capable of forming the conductive channels of the transistors.

Then the pattern etching is performed, and the semiconductor material outside the position where the conductive channels need to be formed is removed. Part of the semiconductor material which is remained forms the conductive channels. Herein, the patterns formed by the pattern etching is the shape of the conductive channels, which may be columns with square cross-sections, columns with rectangular cross-sections, columns with rhombic cross-sections, columns with circular cross-sections and columns with other shapes of cross-sections. These columns form the conductive channels of the transistors.

Figure 7:
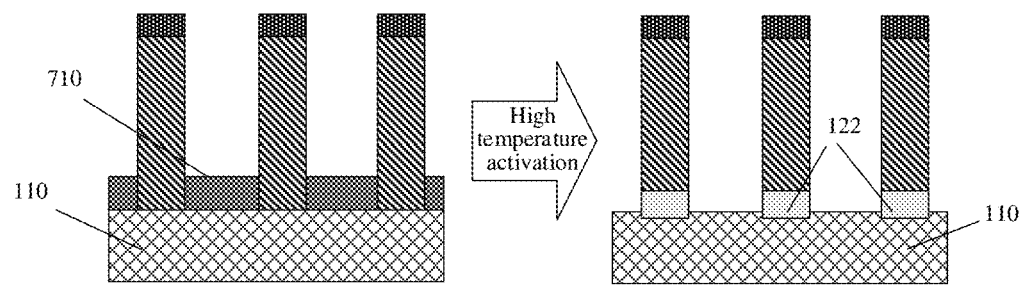
FIG. 7 is a schematic diagram for forming source electrodes in a method for manufacturing a memory according to an embodiment of this application.

In some embodiments, as shown in FIG. 7, the operation that the source electrodes 122 of the transistors are formed at one end, close to the surface of the substrate 110, of the conductive channels 121 includes the following operations.

A heavy-doped dielectric layer 710 is deposited on the surface of the substrate.

The heavy-doped dielectric layer 710 is activated at a high temperature, to form the source electrodes 122 at one end, close to the surface of the substrate, of the conductive channels.

Herein, the heavy-doped dielectric layer may be the semiconductor material containing doped ions with opposite polarity to that of the conductive channels. For example, if the conductive channels are N-type doping, the heavy-doped dielectric layer is P-type doping, and if the conductive channels are P-type doping, the heavy-doped dielectric layer is N-type doping.

Thus, the conductive ions in the heavy-doped dielectric layer are activated by high temperature activation, so that the conductive ions are transferred into the conductive channels, the ions with opposite polarity are injected into the ends, close to the surface of the substrate, of the conductive channels, and then the source electrodes of the transistors are formed.

After high temperature activation and forming the source electrodes at the bottoms of the conductive channels, the heavy-doped dielectric layer may be removed by etching again. In order to prevent the heavy-doped dielectric layer material from remaining on the surface of the substrate, a part of the substrate may be overetched during the etching, so that a part of the source electrodes of the transistors is embedded in the substrate, and a part of the source electrodes is exposed on the substrate.

In some embodiments, the operation that the drain electrodes of the transistors are formed at one end, away from the surface of the substrate, of the conductive channels includes the following operations.

Monocrystalline silicon layers are epitaxially grown at one end, away from the surfaces of the substrate, of the conductive channels.

Ion injection or doping is performed on the monocrystalline silicon layers to form the drain electrodes.

When forming the above drain electrodes, the monocrystalline silicon may epitaxially be grown at one end, away from the surface of the substrate, of the conductive channels of the transistors, and doping or ion injection is further performed, so that the P-type or N-type semiconductor is formed. It is noted that the doping polarity of the drain electrodes is opposite to the polarity of the conductive channels, so as to form the transistors with a PNP or NPN structure.

In some embodiments, the method further includes the following operations.

A first insulation layer is formed around the source electrodes of the transistors, and the height of the first insulation layer relative to the surface of the substrate is higher than that of the source electrodes relative to the surface of the substrate.

After forming the source electrodes of the transistors, storage layers corresponding to the transistors may be further formed on the sides of the conductive channels of the transistors. However, the storage layers cannot be interconnected with the source electrodes, so that the source electrodes of the transistors may be isolated and protected by forming the first insulation layer covering the source electrodes, and then the storage layers corresponding to the transistors are formed.

Herein, the material of the first oxide layer may be an insulation film formed by silicon oxide, silicon nitride or other organic materials etc.

In some embodiments, the method further includes the following operations.

Second insulation layers are formed between two storage layers corresponding to the pair of transistors, in which the second insulation layers are interconnected with the first insulation layers.

Herein, after forming the storage layers corresponding to each transistor, the second insulation layers may be formed between two storage layers corresponding to a pair of transistors, and the second insulation layers are interconnected with the first insulation layers. Thus, the second insulation layers may wrap the storage layers to prevent electric charges from leaking and improve the storage performance.

The material of the second insulation layer may be the same or different from that of the first insulation layer. Moreover, the second insulation layer may be formed by depositing the insulation material to fill up the trenches between a pair of transistors, so that the effect of isolating the storage layer of each transistor is achieved.

In some embodiments, the method further includes the following operations.

At least one bit line is formed at one side, away from the surface of the substrate, of the transistors, and the bit line is interconnected with the drain electrodes of the transistors.

In the embodiments of this application, one end, away from the surface of the substrate, of each transistor, is located in an approximate plane by filling a second oxide layer in the trenches between the transistors. In this case, the metal materials, semiconductor materials or other materials with stronger conductive performance may be coated on the uppermost layer so as to form the conductive layer.

Then redundant conductive material is removed from the conductive layer by pattern etching, and the conductive material in form of a line is remained so as to form the bit line.

The bit line is connected with the drain electrodes of the transistors, so as to transfer electric charges.

In some embodiments, the operation of forming at least a pair of transistors on the surface of the substrate further includes the following operations.

The gate electrodes of the transistors each are formed on one side parallel to the conductive channels, in which two conductive channels of a pair of transistors both are located between two gate electrodes of the pair of transistors.

The gate electrodes of the transistors may be formed on the other sides, opposite to the sides, on which the storage layers are formed, of the conductive channels of the transistors. Therefore, the gate electrodes may be formed before or after forming the storage layers.

After forming the gate electrodes and the storage layers, the structure of each pair of transistors and the corresponding storage layer is arranged in an order of the gate electrode, the conductive channel, the storage layer, the storage layer, the conductive channel and the gate electrode. Thus, the structure formed by each pair of transistors and the storage layers is an axisymmetric structure with a central line of the two storage layers as an axis.

In some embodiments, the operation that the gate electrodes of the transistors are formed on one side parallel to the conductive channels includes the following operations.

The gate oxide layers interconnected with the conductive channels are formed on one side parallel to the conductive channels.

The gate conductive layers interconnected with the gate oxide layers each are formed on one side of the gate oxide layers. Herein, the gate oxide layers are located between the gate conductive layers and the conductive channels, or the gate oxide layers wrap the gate conductive layers, and are interconnected with the conductive channels.

The gate electrodes of the transistors include gate oxide layers and gate conductive layers. The gate oxide layers may be firstly formed on one side of the conductive channels of the transistors, and then the gate conductive layers are formed. Alternatively, the gate oxide layers may be firstly formed, trenches are formed in the middle of the gate oxide layers by etching, and then the gate conductive layers are formed in the trenches, so that the gate conductive layers are wrapped by the gate oxide layers.

In some embodiments, the method further includes the following operations.

The gate protective layers covering the gate electrodes are formed at one end, away from the surface of the substrate, of the gate electrodes.

Since the tops of the gate conductive layers, i.e., one end away from the surface of the substrate may be exposed, the gate protective layers for insulation may be provided to cover the gate electrodes from the above of the gate electrodes, in order to protect the gate conductive layers from suffering external disturbance.

The gate protective layers may be formed by oxides or insulation materials, such as silicon nitride. Certainly, the gate protective layers may also be a film of the same material as the gate oxide layers, and are interconnected with the gate oxide layers so as to protect and isolate the gate conductive layers.

In some embodiments, the operation that the gate electrodes of the transistors are formed on one side parallel to the conductive channels includes the following operations.

Through trenches are formed on one side of at least two transistors located in the same straight line and in different pairs.

The gate electrodes interconnecting the at least two transistors with each other are formed in the trenches, in which the interconnected gate electrodes form a word line of the at least two transistors.

During forming the gate electrodes, the through trenches may be formed at the other sides, relative to the storage layers, of the conductive channels of the transistors, so as to form the gate electrode shared by one row of transistors. The gate electrode shared by the row of transistors becomes a corresponding word line.

Embodiments of this application further provide the following examples.

Figure 8:
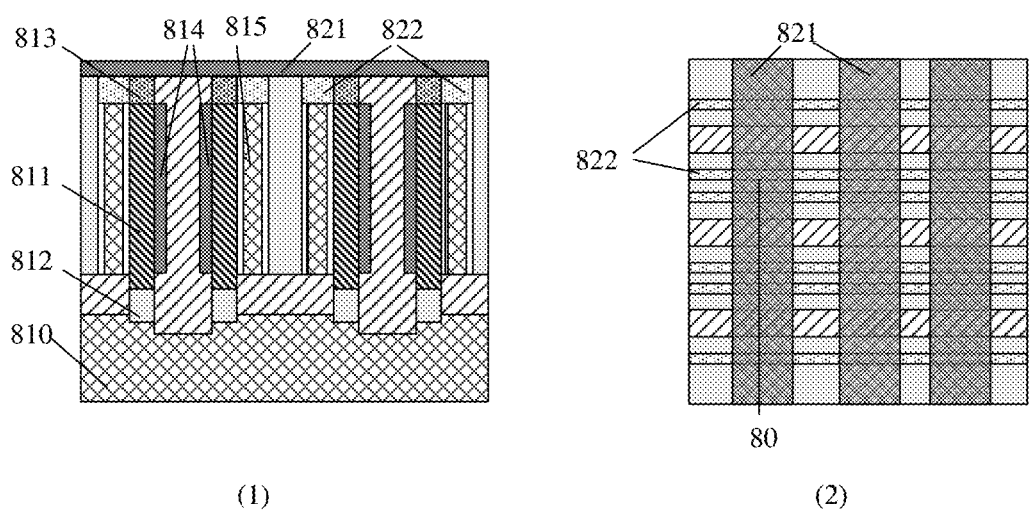
FIG. 8 is a schematic diagram of a memory according to an embodiment of this application.

As shown in FIG. 8, the embodiments of this application provide a schematic diagram of a memory, that is, a DRAM with perpendicular channels and without a capacitor structure, i.e., 1T0C DRAM. As shown in the cross-section view of the memory in part (1) of FIG. 8, the conductive channels 811 of the transistors are perpendicular to the surface of the substrate 810. The source electrodes 812 are located at one end close to the surface of the substrate 810, and the drain electrodes 813 are located at one end away from the surface of the substrate 810. Two inner sides of a pair of transistors are respectively provided with two storage layers 814, which are interconnected with the conductive channels 811 of the transistors. Moreover, the gate electrodes 815 of the transistors are located on outer sides of a pair of transistors. The insulation material is filled between the transistors to isolate the transistors from each other. Because no capacitors are needed, a size of each storage unit (a transistor and a storage layer corresponding to the transistor) may be reduced to 2F2, in which F represents the minimum overall dimension of the storage unit, and F2 represents unit area. Moreover, the conductive channels 811 extend in the direction perpendicular to the surface of the substrate 810, so the length of the conductive channels 811 may be increased without occupying more surface area of the substrate 810.

The top view of the memory is shown in part (2) of FIG. 8. The conductive material is provided to cover the tops of each pair of transistors and connect the whole column of transistors, so as to form the bit lines 821. The gate electrodes of the transistors connect the whole row of transistors to form the word lines. The gate electrodes are not shown in the top view in part (2) of FIG. 8, but the gate protective layers 822 that are at the tops of the gate electrodes and located at the positions corresponding to the word lines can be seen. The cross-section shown in part (1) of FIG. 8 corresponds to one along the straight line 80 shown in part (2) of FIG. 8.

The method for forming the above structure includes the following steps.

Figure 9:
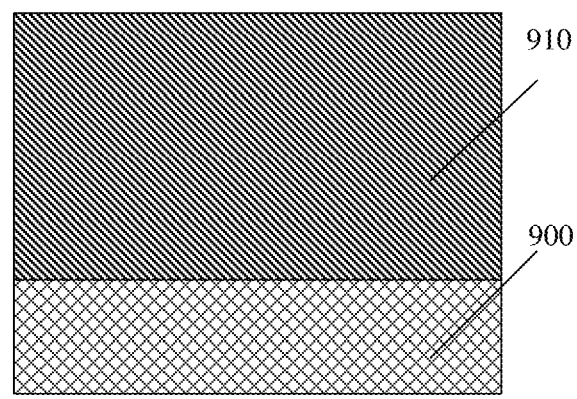
FIG. 9 is a schematic diagram of a substrate of a memory according to an embodiment of this application.

At S1, as shown in FIG. 9, P-type or N-type doping is performed on the silicon substrate 900 in a certain thickness, so as to form the active layer 910.

Figure 10:
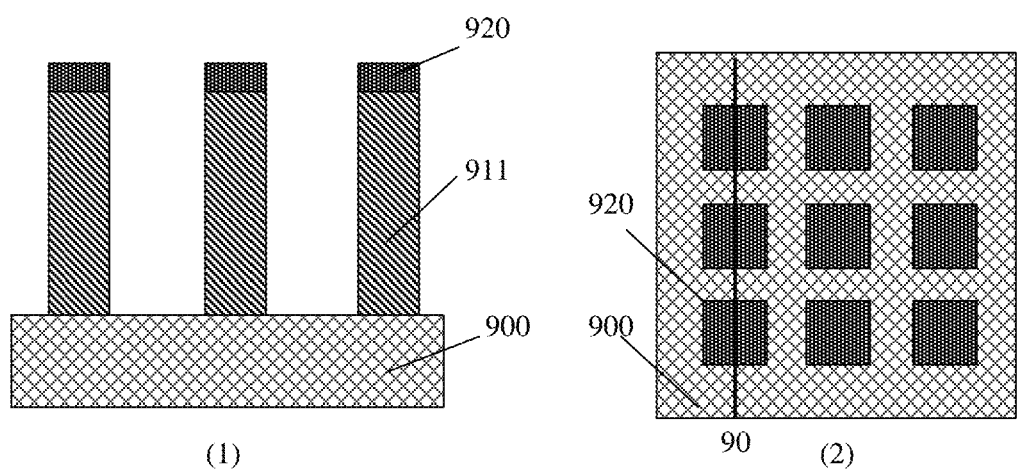
FIG. 10 is a schematic diagram for forming conductive channels in a memory according to an embodiment of this application.

At S2, as shown in FIG. 10, the mask layer 920 is provided to cover the active layer 910, and the pattern etching is performed to remove the active layer other than the conductive channels. The remaining semiconductor structures form the conductive channels 911. The conductive channels 911 may have a cross-section in square, rhombus or other shapes. The above mask layer 920 may be silicon nitride. In FIG. 10, part (1) is a cross-section view, part (2) is a top view, and the black line 90 represents the position where the cross-section of part (1) is from.

Figure 11:
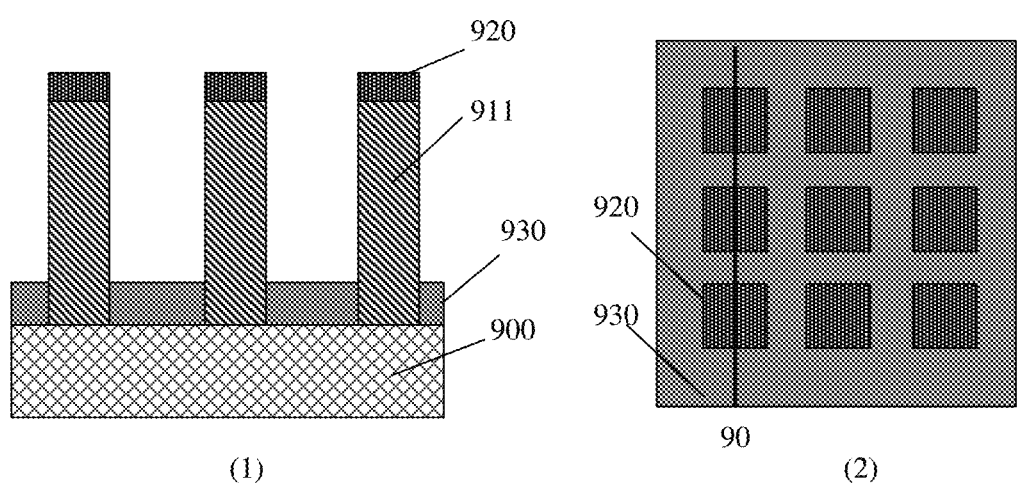
FIG. 11 is a schematic diagram I for forming source electrodes of transistors in a memory according to an embodiment of this application.

At S3, as shown in FIG. 11, the heavy-doped dielectric layer 930 is deposited in the gaps between the conductive channels on the surface of the substrate, and the doped ion is a type opposite to that of the active area. In FIG. 11, part (1) is a cross-section view, part (2) is a top view, and the black line 90 represents the position where the cross-section of part (1) is from.

Figure 12:
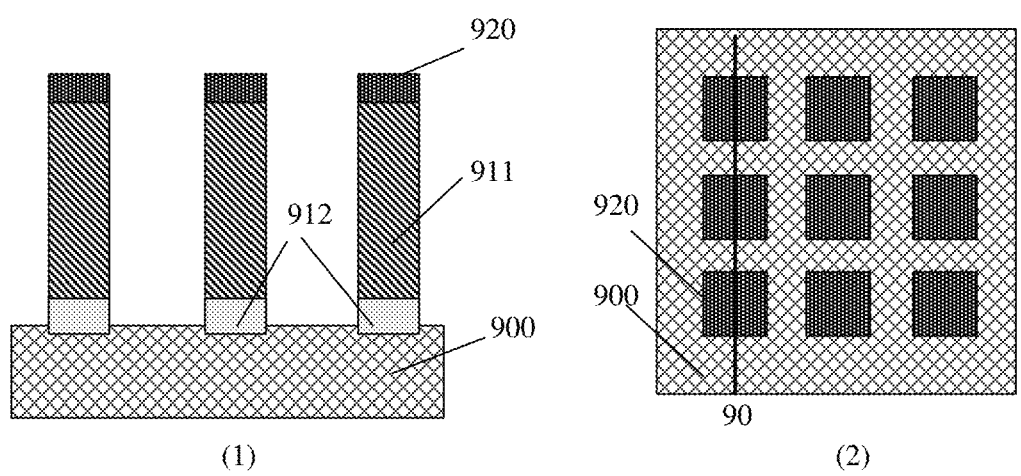
FIG. 12 is a schematic diagram II for forming source electrodes of a transistor in a memory according to an embodiment of this application.

At S4, as shown in FIG. 12, high temperature activation is performed after depositing the heavy-doped dielectric layer 930, so that the source electrodes 912 or drain electrodes are formed at the bottom of the active area, i.e., at the bottom of the conductive channels, and then the heavy-doped dielectric layer 930 may be removed by etching. Herein, in order to completely remove the heavy-doped dielectric layer, a part of the substrate may be overetched such that a part of source electrodes 912 are located above the surface of the substrate 900. In FIG. 12, part (1) is a cross-section view, part (2) is a top view, and the black line 90 represents the position where the cross-section of part (1) is from.

Figure 13:
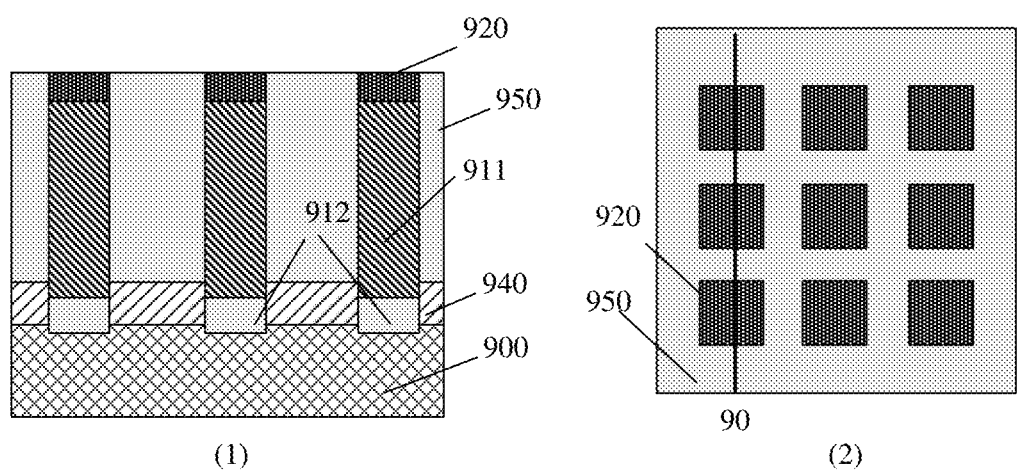
FIG. 13 is a schematic diagram for isolating transistors mutually in a memory according to an embodiment of this application.

At S5, as shown in FIG. 13, the oxide layers 940 are deposited on the surface of the substrate, and the surfaces of the oxide layers 940 may be slightly higher than those of the source electrodes 912, so as to effectively isolate the source electrodes. Then, an insulation dielectric layer 950 may be filled above the oxide layers 940. The material of the insulation dielectric layer 950 may be inorganic materials, such as silicon oxide or silicon nitride, or organic insulation materials. In FIG. 13, part (1) is a cross-section view, part (2) is a top view, and the black line 90 represents the position where the cross-section of part (1) is from.

Figure 14:
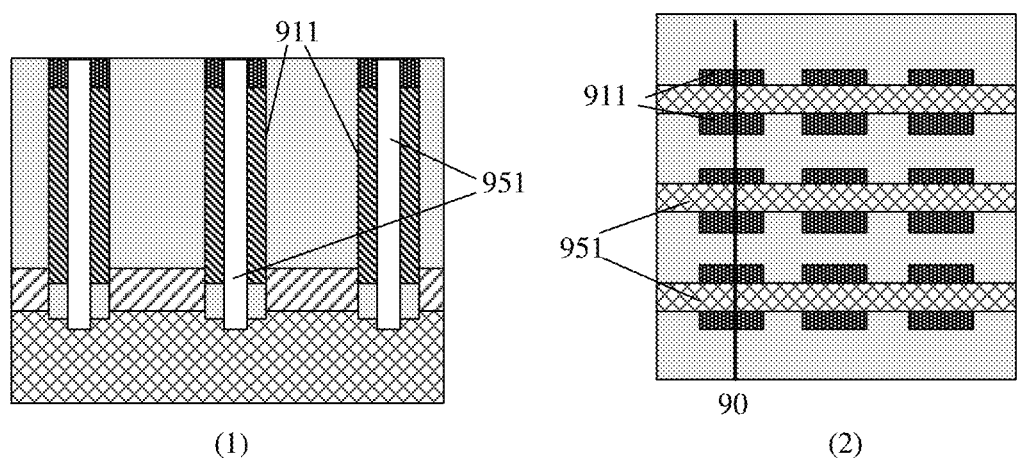
FIG. 14 is a schematic diagram for forming paired transistors in a memory according to an embodiment of this application.

At S6, as shown in FIG. 14, the trenches 951 are formed in the middle of each active area by pattern etching, so that each active area is divided into two parts, i.e., two conductive channels 911 of a pair of transistors. The source electrodes at the bottom are separated by overetching the substrate. In FIG. 14, part (1) is cross-section view, part (2) is a top view, and the black line 90 represents the position where the cross-section of part (1) is from.

Figure 15:
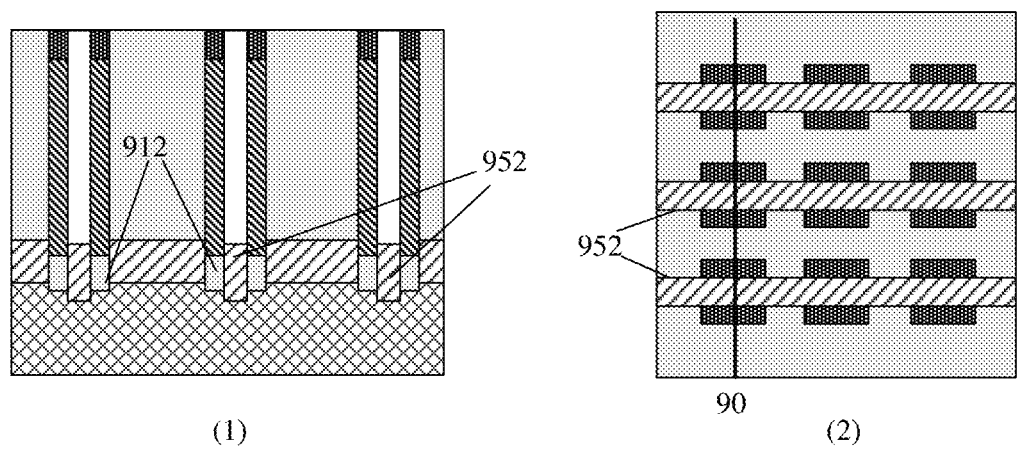
FIG. 15 is a schematic diagram for forming isolation between paired transistors in a memory according to an embodiment of this application.

At S7, as shown in FIG. 15, the oxide layers 952 are deposited in the trenches 950, and the upper surfaces of the oxide layers 952 are slightly higher than those of the source electrodes 912, so that the active areas are isolated independently. In FIG. 15, part (1) is a cross-section view, part (2) is a top view, and the black line 90 represents the position where the cross-section of part (1) is from.

Figure 16:
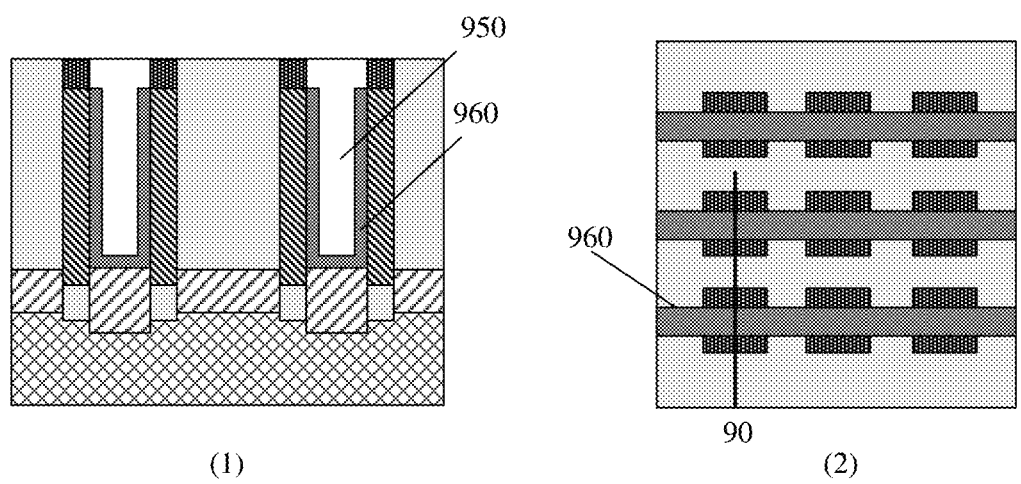
FIG. 16 is a schematic diagram I for forming storage layers between paired transistors in a memory according to an embodiment of this application.

At S8, as shown in FIG. 16, at least one of the semiconductor material layer or metal material layer is formed in the trenches 950. The semiconductor layer may be a Si layer. The semiconductor material may include at least one of Ge, Si—Ge, Al—Sb or Ga—Sb. The valence band of the semiconductor material layer is higher than that of the active area, and quantum dots may be provided in the semiconductor to store electrons. That is, the storage layers 960 are formed. In FIG. 16, part (1) is a cross-section view, part (2) is a top view, and the black line 90 represents the position where the cross-section of part (1) is from.

Figure 17:
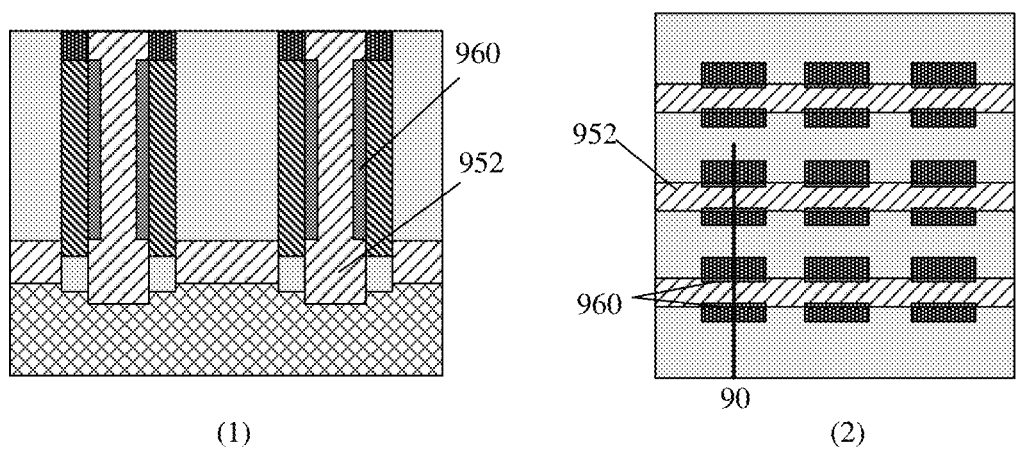
FIG. 17 is a schematic diagram II for forming storage layers between paired transistors in a memory according to an embodiment of this application.

At S9, as shown in FIG. 17, the semiconductor materials at the bottoms of the trenches are removed by etching back, and the insulation oxide layer 952 is filled. Thus, two mutually isolated storage layers 960 are formed. In FIG. 17, part (1) is a cross-section view, part (2) is a top view, and the black line 90 represents the position where the cross-section of part (1) is from.

Figure 18:
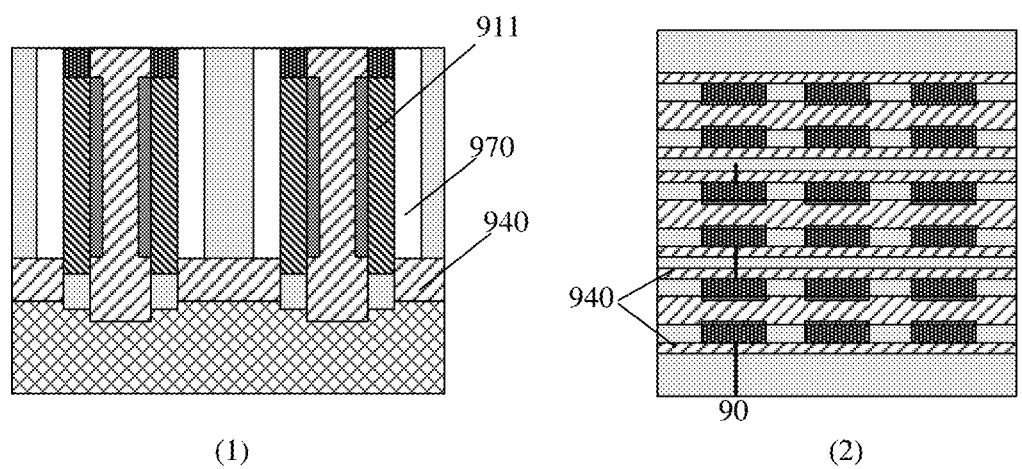
FIG. 18 is a schematic diagram I for forming gate electrodes of transistors in a memory according to an embodiment of this application.

At S10, as shown in FIG. 18, the trenches 970 are formed in the isolation layers located at outer sides of the conductive channels 911 by pattern etching, so as to expose the active area. The oxide layers 940 are used as etching stopping layers to prevent the source electrodes from being exposed by the trenches. In FIG. 18, part (1) is a cross-section view, part (2) is a top view, and the black line 90 represents the position where the cross-section of part (1) is from.

Figure 19:
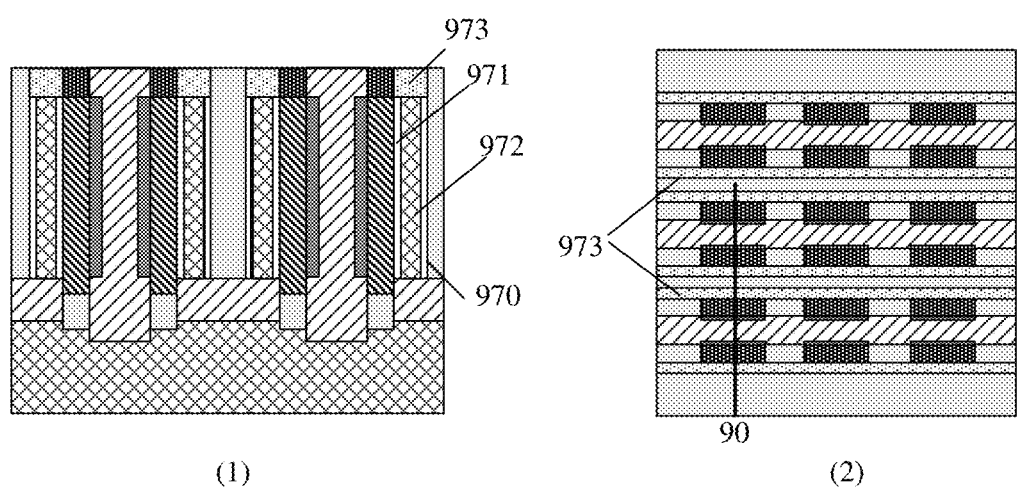
FIG. 19 is a schematic diagram II for forming gate electrodes of transistors in a memory according to an embodiment of this application.

At S11, as shown in FIG. 19, the gate oxide layers 971 and the gate metal layers 972 are deposited in the above trenches 970 and etched back to a level horizontal to the active area, and then the gate protective layer 973 is filled. In FIG. 19, part (1) is a cross-section view, part (2) is a top view, and the black line 90 represents the position where the cross-section of part (1) is from.

Figure 20:
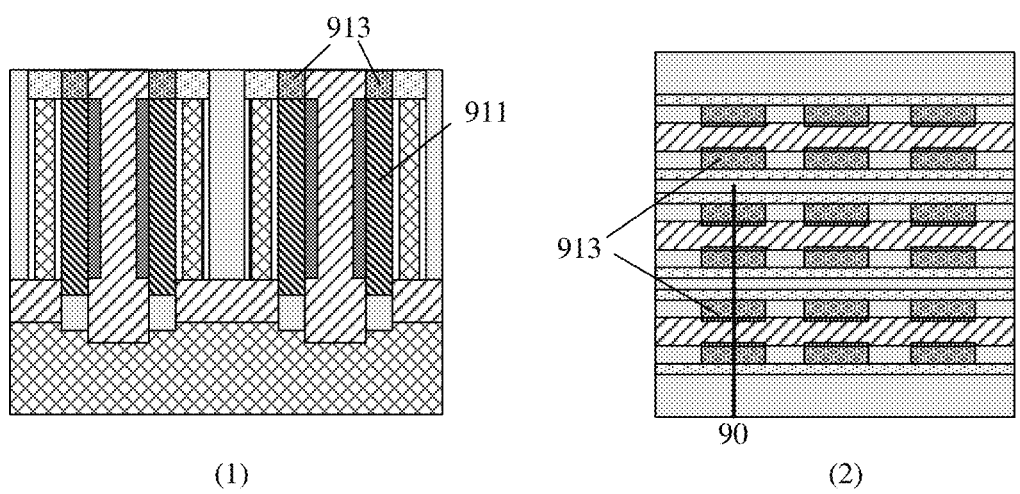
FIG. 20 is a schematic diagram for forming drain electrodes of transistors in a memory according to an embodiment of this application.

At S12, as shown in FIG. 20, the mask layer at the tops of the conductive channels 911, i.e., at the tops of the active layers, are removed, the monocrystalline silicon layers are epitaxially grown, and then the drain electrodes 913 of the transistors are formed by ion injection or doping. In FIG. 20, part (1) is a cross-section view, part (2) is a top view, and the black line 90 represents the position where the cross-section of part (1) is from.

Figure 21:
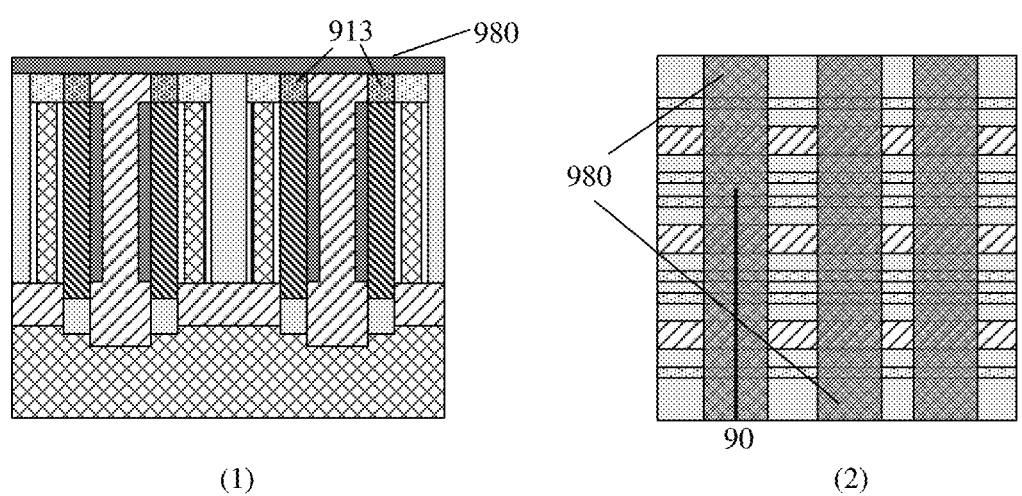
FIG. 21 is a schematic diagram for forming bit lines in a memory according to an embodiment of this application.

At S13, as shown in FIG. 21, the conductive layer is formed at the tops of the transistor structures, and then the bit lines 980 connected with the drain electrodes 913 are formed by pattern etching. In FIG. 21, part (1) is a cross-section view, part (2) is a top view, and the black line 90 represents the position where the cross-section of part (1) is from.

It should be understood that the terms "one embodiment" or "an embodiment" used throughout the specification means that specific features, structures, or characteristics related to embodiments are included in at least one embodiment of the disclosure. Therefore, the terms "in one embodiment" or "in an embodiment" used throughout the specification do not necessarily refer to a same embodiment. Moreover, these specific features, structures, or characteristics may be combined in one or more embodiments in any appropriate manner. It should be understood that in the various embodiments of this application, the serial numbers of the processes described in the above do not represent the order of execution and shall not form any limitation to the implementation of the embodiments of this application. The order of execution of various processes shall be determined by their functions and internal logic. The serial numbers of the embodiments of this application are only for the purpose of description and do not represent the preferabilities of the embodiments.

It should be noted that the terms "include" and "contain" or any other variant are intended to cover nonexclusive inclusions herein, so that a process, method, object or device including a series of elements not only includes these elements but also may include other elements which are not clearly listed or further includes elements intrinsic to the process, the method, the object or the device. Without further limitations, an element defined by the statement "including a/an . . . " does not exclude the presence of additional same elements in a process, method, object or device including the element.

In the embodiments of the application, it should be understood that the disclosed device and method may be implemented through other manners. The embodiment of the device described above is merely an example. For example, the unit division is merely a logical function division and may be other division in actual implementation. For example, a plurality of units or components may be combined or integrated into another system, or some features may be omitted or not be performed. In addition, the mutual coupling or direct coupling or communication connection between components as shown or discussed in the above may be implemented by using some interfaces. The indirect coupling or communication connection between the devices or units may be implemented in electronic, mechanical, or other forms.

The units described as separate parts may or may not be physically separated. Parts shown as units may or may not be physical units, may be located in one location, or may be distributed on a plurality of network units. Some or all of the units may be selected according to actual needs to achieve the purpose of the solution of the embodiment.

In addition, functional units in each embodiment of this application may be integrated into one processing unit, or each unit may be used as a separate unit, or two or more units may be integrated in one unit. The abovementioned integrated units may be realized either in the form of hardware or in the form of hardware plus software functional units.

The above description is only the implementation modes of this application, but the scope of protection of this application is not limited to this. Those skilled in the art can easily think of changes or replacements within the scope of the technology disclosed in this application, which shall be covered by the scope of protection of this application. Therefore, the scope of protection of this application should only be limited by the scope of protection of the appended claims.

INDUSTRIAL APPLICABILITY

Embodiments of this application provide a memory and a method for manufacturing same. The method according to an embodiment of the present application is applied to the industrial production of the memory. Through the technical solutions of the embodiments of this application, the storage layer located on the side surface of the transistor is used for the storage of electric charges and the electric charge transfer between the storage layer and the conductive channel so as to obtain a storage unit without a capacitor and reduce the occupied area and complexity of each storage unit. Moreover, the transistor and the storage layer are configured to extend in a direction perpendicular to the surface of the substrate, so as to effectively use the structure space in the perpendicular direction and save the surface area of the memory, which is more beneficial to design and manufacture the miniaturized and highly integrated memory.

The invention claimed is:

1. A memory, comprising:
 a substrate;
 a plurality of transistors arranged on a surface of the substrate in pairs, the plurality of transistors being at least one pair of transistors, wherein conductive channels of the plurality of transistors extend in a direction perpendicular to the surface of the substrate;
 storage layers, each of the storage layers being located, in the direction perpendicular to the surface of the substrate, on a side surface of each of the plurality of transistors, wherein the storage layers are interconnected with the conductive channels of the plurality of transistors, any one of the storage layers is located between each of the at least one pair of transistors, and the storage layers are configured to store electric charges and transfer the electric charges between the storage layers and the conductive channels interconnected therewith;
 first insulation layers, provided between two of the storage layers corresponding to each pair of transistors of the at least one pair of transistors; and
 two gate electrodes corresponding to the each pair of transistors of the at least one pair of transistors, respectively located on a side surface of the conductive channels and parallel to the conductive channels, wherein two of the conductive channels of each pair of transistors of the at least one pair of transistors are both located between the two gate electrodes of each pair of transistors of the at least one pair of transistors.

2. The memory of claim 1, wherein source electrodes of the plurality of transistors are located at one end, close to the surface of the substrate, of the conductive channels; and drain electrodes of the plurality of transistors are located at one end, away from the surface of the substrate, of the conductive channels.

3. The memory of claim 2, wherein second insulation layers are provided around the source electrodes of the plurality of transistors to cover the source electrodes of the plurality of transistors, and a height of the second insulation layers relative to the surface of the substrate is higher than that of the source electrodes relative to the surface of the substrate.

4. The memory of claim 3, wherein the first insulation layers are interconnected with the second insulation layers.

5. The memory of claim 2, further comprising:
at least one bit line, which is located at one side, away from the surface of the substrate, of the plurality of transistors, and is interconnected with the drain electrodes of the plurality of transistors, wherein the at least one bit line covers surfaces of the drain electrodes of the at least one pair of transistors.

6. The memory of claim 1, wherein each of the two gate electrodes comprises:
a gate oxide layer, a gate conductive layer, and a gate protective layer, which covers one side, away from the surface of the substrate, of a corresponding one of the two gate electrodes;
the gate oxide layer is located between the gate conductive layer and a corresponding one of the conductive channels; or the gate oxide layer wraps the gate conductive layer and is interconnected with the corresponding one of the conductive channels.

7. The memory of claim 1, wherein gate electrodes of at least two transistors are interconnected with each other, the gate electrodes interconnected with each other form word lines of the at least two transistors, and the at least two transistors are located in a same straight line and in different pairs.

8. A method for manufacturing a memory, comprising:
forming a plurality of transistors on a surface of a substrate in pairs, the plurality of transistors being at least one pair of transistors, wherein conductive channels of the plurality of transistors extend in a direction perpendicular to the surface of the substrate;
forming each of storage layers, in the direction perpendicular to the surface of the substrate, on a side surface of each of the plurality of transistors, wherein the storage layers are interconnected with the conductive channels of the plurality of transistors, and any one of the storage layers is located between each of the at least one pair of transistors, and the storage layers are configured to store electric charges and transfer the electric charges between the storage layers and the conductive channels interconnected therewith;
forming first insulation layers between two of the storage layers corresponding to each pair of transistors of the at least one pair of transistors; and
forming two gate electrodes corresponding to the each pair of transistors of the at least one pair of transistors respectively on a side surface of the conductive channels and parallel to the conductive channels, wherein two of the conductive channels of each pair of transistors of the at least one pair of transistors are both located between the two gate electrodes of each pair of transistors of the at least one pair of transistors.

9. The method of claim 8, wherein the forming each of storage layers, in the direction perpendicular to the surface of the substrate, on a side surface of each of the plurality of transistors comprises:
forming trenches between the two of the conductive channels of each pair of transistors of the at least one pair of transistors;
depositing a semiconductor material or a metal material in the trenches, so as to cover side walls and bottoms of the trenches; and
removing the semiconductor material or the metal material at the bottoms of the trenches by etching, to form the storage layers corresponding to the plurality of transistors.

10. The method of claim 8, wherein the forming a plurality of transistors on a surface of a substrate in pairs comprises:
forming the conductive channels perpendicular to the surface of the substrate on the surface of the substrate;
forming source electrodes of the plurality of transistors at one end, close to the surface of the substrate, of the conductive channels; and
forming drain electrodes of the plurality of transistors at one end, away from the surface of the substrate, of the conductive channels.

11. The method of claim 10, wherein the forming the conductive channels perpendicular to the surface of the substrate on the surface of the substrate comprises:
performing doping on a silicon material substrate, so as to form an active layer; and
performing pattern etching on the active layer, so as to form the conductive channels perpendicular to the surface of the substrate.

12. The method of claim 10, wherein the forming source electrodes of the plurality of transistors at one end, close to the surface of the substrate, of the conductive channels comprises:
depositing a heavy-doped dielectric layer on the surface of the substrate; and
activating the heavy-doped dielectric layer at a high temperature, to form the source electrodes at the one end, close to the surface of the substrate, of the conductive channels.

13. The method of claim 10, wherein the forming drain electrodes of the plurality of transistors at one end, away from the surface of the substrate, of the conductive channels comprises:
epitaxially growing monocrystalline silicon layers at the one end, away from the surface of the substrate, of the conductive channels; and
performing ion injection or doping on the monocrystalline silicon layers to form the drain electrodes.

14. The method of claim 10, further comprising:
forming second insulation layers around the source electrodes of the plurality of transistors, and a height of the second insulation layers relative to the surface of the substrate being higher than that of the source electrodes relative to the surface of the substrate, and the first insulation layers are interconnected with the second insulation layers.

15. The method of claim 10, further comprising:
forming at least one bit line at one side, away from the surface of the substrate, of the plurality of transistors, wherein the at least one bit line is interconnected with the drain electrodes of the plurality of transistors.

16. The method of claim 8, wherein the forming two gate electrodes corresponding to each pair of transistors of the at least one pair of transistors respectively on one side parallel to the conductive channels comprises:
forming gate oxide layers interconnected with the conductive channels on one side parallel to the conductive channels; and
forming gate conductive layers interconnected with the gate oxide layers at one side of the gate oxide layers, wherein the gate oxide layers are located between the gate conductive layers and the conductive channels, or the gate oxide layers wrap the gate conductive layers, and are interconnected with the conductive channels.

17. The method of claim 16, further comprising:
forming gate protective layers covering the two gate electrodes at one end, away from the surface of the substrate, of the two gate electrodes.

18. The method of claim 8, wherein the forming two gate electrodes corresponding to each pair of transistors of the at least one pair of transistors respectively on one side parallel to the conductive channels comprises:
forming through trenches at one side of at least two transistors located in a same straight line and in different pairs; and
forming the gate electrodes interconnecting the at least two transistors with each other in the trenches, wherein the gate electrodes which are interconnected with each other form word lines of the at least two transistors.

* * * * *